United States Patent

Edelstein et al.

[11] Patent Number: 6,133,136
[45] Date of Patent: Oct. 17, 2000

[54] ROBUST INTERCONNECT STRUCTURE

[75] Inventors: Daniel Charles Edelstein, New Rochelle; Vincent McGahay, Poughkeepsie, both of N.Y.; Henry A. Nye, III, Brookfield, Conn.; Brian George Reid Ottey, Poughkeepsie; William H. Price, Cortlandt Manor, both of N.Y.

[73] Assignee: International Business Machines Corporation, Armonk, N.Y.

[21] Appl. No.: 09/314,003

[22] Filed: May 19, 1999

[51] Int. Cl.$^7$ .................................................. H01L 21/4763
[52] U.S. Cl. ..................... 438/618; 438/627; 438/628; 438/637; 257/762; 257/751; 257/750; 156/664
[58] Field of Search ..................... 438/618, 637, 438/688, 627, 628, 643, 644; 257/762, 765, 751, 750

[56] References Cited

U.S. PATENT DOCUMENTS

| | | |
|---|---|---|
| 4,434,434 | 2/1984 | Bhattacharya et al. ................... 357/71 |
| 5,268,072 | 12/1993 | Agarwala et al. ....................... 156/664 |
| 5,629,564 | 5/1997 | Nye, III et al. .......................... 257/762 |
| 5,785,236 | 7/1998 | Cheung et al. ...................... 228/180.5 |
| 5,795,819 | 8/1998 | Motsiff et al. ........................... 438/618 |

FOREIGN PATENT DOCUMENTS 0 751 566 A2  1/1997  European Pat. Off. .

OTHER PUBLICATIONS

Dielectric/Metalization Joint PTAB, *Sematech*, Mar. 18–19, 1999, Orlando, FL.

*Primary Examiner*—Charles Bowers
*Assistant Examiner*—Hsien Ming Lee
*Attorney, Agent, or Firm*—Pollock, Vande Sande & Amernick; Joseph P. Abate

[57] ABSTRACT

A structure comprising a layer of copper, a barrier layer, a layer of AlCu, and a pad-limiting layer, wherein the layer of AlCu and barrier layer are interposed between the layer of copper and pad-limiting layer.

37 Claims, 1 Drawing Sheet

ROBUST INTERCONNECT STRUCTURE

TECHNICAL

The present invention relates to metal interconnects and more particularly to a robust copper interconnect structure. The present invention finds particular applicability for VLSI and ULSI copper interconnects especially for packaging.

BACKGROUND OF INVENTION

Interest in using copper as interconnects in semiconductor devices continues to increase since it possesses a lower resistivity and a reduced susceptibility to electromigration failure as compare to the more traditional aluminum or aluminum alloy interconnects.

However, since copper has a tendency when used in interconnect metallurgy to diffuse into surrounding dielectric materials such as silicon dioxide, capping of the copper is essential. The capping inhibits this diffusion. One widely suggested method of capping includes employing a conductive barrier layer along the sidewalls and bottom surface of a copper interconnect. Typical of such barrier layers is tantalum or titanium. Capping of the upper surface of a copper interconnect usually employs silicon nitride.

However, silicon nitride does not exhibit strong adhesion to copper surfaces despite various adhesion treatments. Accordingly, the silicon nitride-to-copper interface is susceptible to delamination under conditions of mechanical loading.

For example, to assure package reliability, the controlled collapse chip connection (C4) structural integrity must be sound in order to survive the mechanical stresses that the product experiences. Recent studies of C4 pads on copper interconnections reveal relatively weak C4 structural integrity. Failures arose during rework and burn-in operations due to the inherently relatively weak adhesion of the overlying silicon nitride cap to the copper.

SUMMARY OF INVENTION

The present invention provides for improved structural integrity of copper interconnects including C4 over copper BEOL. The present invention provides for interconnect that is robust to mechanical stresses.

More particularly, the structure of the present invention comprises a layer of copper, a pad limiting layer and a layer of AlCu and barrier interposed between the layer of copper and pad-limiting layer.

The present invention also relates to an interconnect structure comprising a layer of copper, a layer of dielectric isolation located over the layer of copper and having a via to expose a portion of the layer of copper, a barrier layer located in the via and over the layer of copper, a layer of AlCu located over the barrier layer, and a pad-limiting layer located over the layer of AlCu.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference will be made to the drawings.

Figure 1:
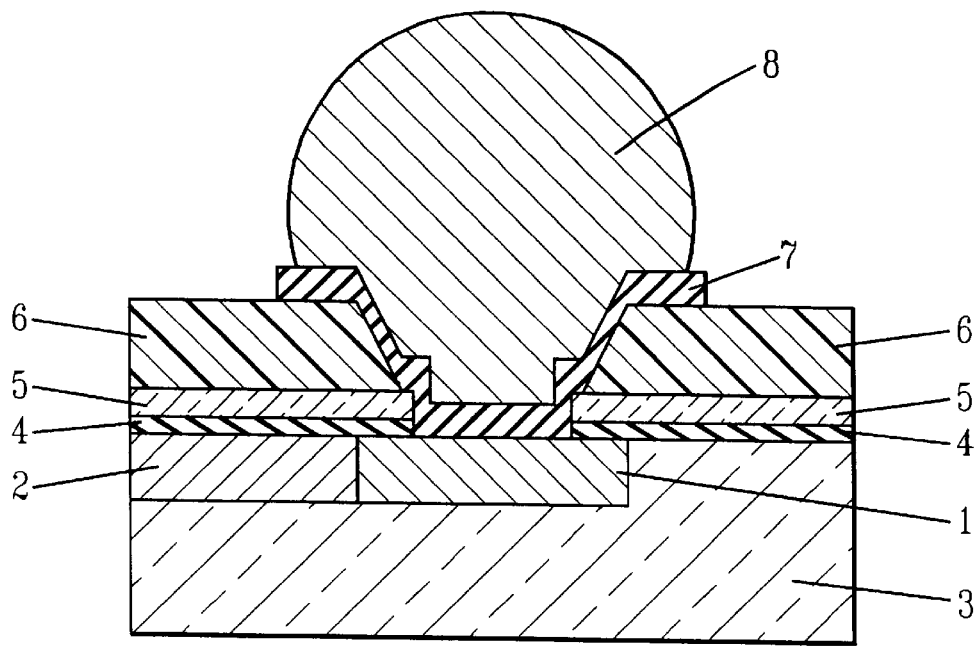
FIG. 1 is a schematic diagram of a prior art C4 over Cu BEOL structure.

In particular, FIG. 1 is a schematic diagram of a prior art C4 over Cu Back End of the Line (BEOL) structure wherein a copper pad 1 is connected to a conductor 2 and within an opening or via through an isolation region 3. Typically, a barrier or liner layer (not shown) will be present on the sides and bottom of the copper pad, between the conductor 2 and isolation region 3.

The isolation region 3 is typically silicon dioxide. The copper layer is typically about 0.3 to about 2 $\mu$m thick and more typically about 0.5 to about 1.2 $\mu$m thick.

A capping layer 4 such as silicon nitride is provided above the copper layer. In the case of silicon nitride, it can be deposited by a well known plasma enhanced chemical vapor deposition process (PECVD). Such process involves introducing a silicon-bearing gas species such as silane and a nitrogen-bearing gas species such as ammonia and/or nitrogen in the presence of a plasma. Other silicon-bearing gas species include disilane, dichlorosilane and tetraethylorthosilicate. Other nitrogen-containing gas species include hexamethyldisilane. The deposition of the silicon nitride is usually carried out at temperatures of about 300 to about 450° C. and more typically at temperatures of about 350 to about 400° C. The layer 4 is typically about 100 to about 20,000 Å thick, more typically for silicon nitride the layer is about 100 to about 1000 Å thick, and even more typically about 350 to about 700 521 thick for silicon nitride.

A via or opening is present in the capping layer 4 to provide access for subsequent interconnection to the C4 pad.

A passivation layer 5 is provided on top of the capping layer 4. The passivation layer 5 also includes an opening or via to provide access for subsequent interconnection with a C4 pad. Passivation layer 5 is typically silicon dioxide, silicon nitride, silicon oxynitride or combinations thereof. In the case of silicon dioxide, the passivation layer 5 can be deposited by well-known techniques such as by plasma enhanced chemical vapor deposition. The preferred layer 5 is a combination of silicon dioxide layer followed by a silicon nitride layer. Typically, the thickness of layer 5 is about 1000 to about 9000 Å.

A dielectric layer 6 is provided above the passivation layer 5. The dielectric layer 6 also includes an opening or via to provide access for subsequent interconnection with a C4 pad.

The preferred dielectric layer 6 is a polyimide. Polyimides suitable include unmodified polyimides, as well as modified polyimides, such as polyesterimides, polyimide-imide-esters, polyimide-imides, polysiloxaneimides, as well as other mixed polyimides. Such are well known in the prior art and need not be described herein in any great detail. The dielectric layer 6 is typically provided by coating with a polyimide precursor and then converting to the cured polyimide by heating. Commercially available polyimide precursors (polyamic acid) or various polyimide precursors from DuPont are available under the trade designation Pyralin. These polyimide precursors come in many grades, including those available under the trade designations PI-2555, PI-2545, PI-2560, PI-5878, PIH-61454 and PI-2540. Some of these are pyromelletic dianhydride-oxydianiline (PMDA-ODA) polyimide precursors.

The dielectric layer 6 is typically about 0.4 to about 5 microns thick and more typically about 10,000 to about 40,000 Å thick.

In the art as currently practiced, located on top of copper 1 is the pad-limiting metallurgy 7. The layer 7 is also present on the sidewalls of the openings in capping layer 4, passivation layer 5 and dielectric layer 6.

The pad-limiting metallurgy layer 7 is typically titanium nitride, copper, gold, titanium tungsten, chromium, which can be deposited as described in U.S. Pat. No. 4,434,434 or U.S. Pat. No. 5,629,564, disclosures of which are incorporated herein by reference. Typically, a combination of layers are used in the pad limiting metallurgy, a particular combination being TiW followed by CrCu and then Cu. The TiW layer is typically about 250 to about 2000 Å thick. The CrCu layer is typically 100 to about 2000 Å thick. The Cu layer is typically about 1000 to 20,000 Å thick. An in-situ sputter clean typically precedes the deposition of the first metal.

A plated C4 pad or bump structure 8 connects directly to the pad limiting layer 7 through the openings or vias in the dielectric layer 6, passivation layer 5 and capping layer 4.

The C4 contact bump structure 8 is mostly Pb-Sn solder and is provided on integrated circuit chips for making interconnections to substrates. The contact bump structure 8 is typically deposited on metal layer 7 for enhanced adhesion. The C4 bump extends above the integrated circuit chip by about 0.100 millimeters and is round or circular in cross-section parallel to the plane of the upper surface of the integrated circuit chip and is curved from its sides to the top surface of the bump where an interconnection is made to another electrode supported by a substrate.

During chip pull rework or post-burn-in, a normal or shear force is exerted on the cap 4 overlying the copper 1. Due to poor adhesion, the cap can crack and delaminate from the copper surface. This failure mode renders the Cu interconnect technology less reliable for multichip module applications and some single chip uses.

Figure 2:
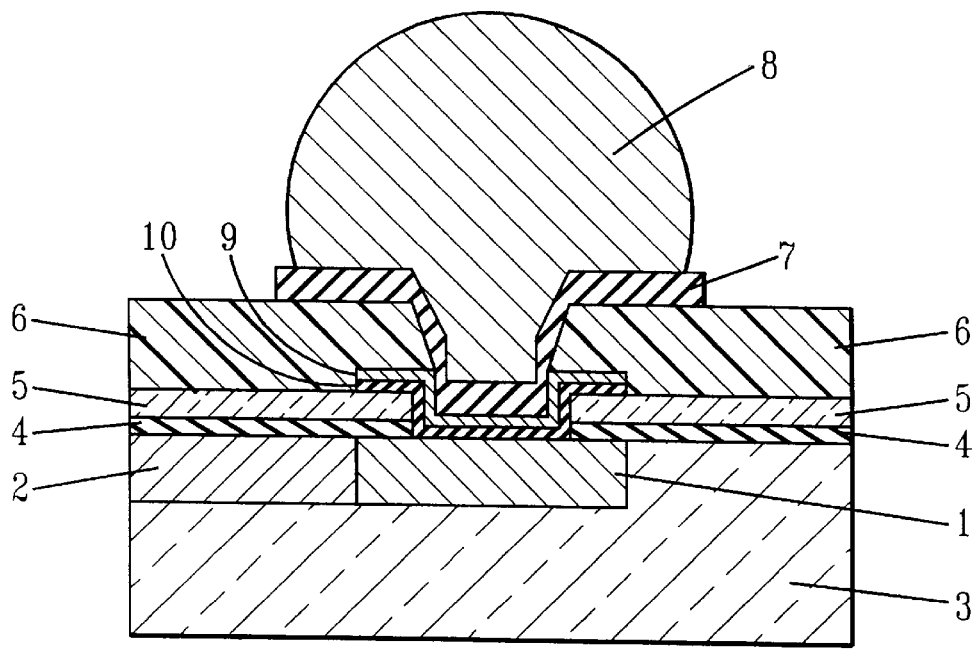
FIG. 2 is a schematic diagram of a C4 over Cu BEOL structure according to the present invention.

Pursuant to the present invention, as illustrated in FIG. 2, a layer 9 of AlCu and barrier 10 are provided between copper layer 1 and pad-limiting layer 7. The AlCu layer typically contains about 96 to about 99.5 atomic % Al, and correspondingly about 4 to about 0.5 atomic % Cu. The AlCu layer 9 is typically about 0.5 to about 1.2 microns. It can be applied by well known sputtering techniques.

The barrier layer 10 is typically titanium, titanium nitride, tantalum or tantalum nitride, or mixtures, combinations or alloys thereof. In addition, often a combination of these barrier layers is employed, a particular combination being TaN followed by Ti and then TiN. The TaN layer is typically about 50 to about 1000 Å thick. The Ti layer is 200 to 700 Å thick. The TiN layer is 200 to 700 Å thick. An in-situ sputter clean typically precedes the deposition of the first metal.

According to preferred aspects of the present invention, the AlCu layer 9 and barrier layer 10 extends above and overlaps passivation layer 5. Moreover, preferably its width is substantially equal to the width of the copper layer 1.

Moreover, in a preferred configuration, the dielectric layer 6 overlaps the overlap portion of the AlCu layer 9 and pad-limiting layer 7 overlaps portions of dielectric layer 6.

The AlCu and barrier layers provide for a robust interconnection of the Cu to the C4 pads. Tensile pull tests carried out demonstrated that the structures according to the present invention reduced the defect rate of 50–70%. for prior art structures as shown in FIG. 1 to 0% for the structures of the present invention.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A structure comprising layer of copper, a barrier layer, a layer of AlCu and a pad-limiting layer, wherein the layer of AlCu and barrier layer are interposed between the layer of copper and pad-limiting layer, and wherein the barrier layer is located between the layer of copper and the layer of AlCu.

2. The structure of claim 1 wherein the layer of copper is about 0.3 to about 2 $\mu$m thick.

3. The structure of claim 1 wherein the layer of AlCu contains about 96 to about 99.5 atomic % of Al.

4. The structure of claim 1 wherein the layer of AlCu is about 0.5 to about 1.2 microns thick.

5. The structure of claim 1 wherein the barrier layer is selected from the group consisting of titanium, tantalum, nitrides thereof, mixtures thereof, combinations thereof and alloys thereof.

6. The structure of claim 1 wherein the barrier layer is about 50 to about 1000 Å thick.

7. The structure of claim 1 wherein the barrier layer is a combination of a TaN layer, a Ti layer and a TiN layer.

8. The structure of claim 7 wherein the TiN layer is about 200 to about 700 Å thick, the Ti layer is about 200 to about 700 Å thick, and the TaN layer is about 50 to about 1000 Å thick.

9. The structure of claim 1 wherein the pad-limiting layer is selected from at least one member from the group consisting of titanium nitride, copper, gold, titanium tungsten, chromium and combinations thereof.

10. The structure of claim 1 wherein the pad-limiting layer comprises a TiW layer, followed by a CrCu layer, followed by a Cu layer.

11. An interconnect structure comprising a layer of copper, a layer of isolation located over the layer of copper and having a via to expose a portion of the layer of copper, a barrier layer located in the via and over the layer of copper, a layer of AlCu located in the via and over the barrier layer, and a pad limiting layer located over the layer of AlCu.

12. The interconnect structure of claim 11, which further comprises controlled collapse chip connection contact bump in contact with the pad limiting layer.

13. The interconnect structure of claim 12 wherein the C4 contact bump is Sn-Pb solder.

14. The interconnect structure of claim 11 which further comprises a passivation layer located over the layer of isolation and having a via that coincides with the via in the layer of isolation.

15. The interconnect structure of claim 14 wherein the layer of AlCu extends above and overlaps the passivation layer.

16. The interconnect structure of claim 15 wherein the layer of the barrier layer extends above and overlaps the passivation layer.

17. The interconnect structure of claim 16 wherein the barrier layer has a width that is substantially equal to the width of the layer of copper.

18. The interconnect structure of claim 15 wherein the layer of AlCu has a width that is substantially equal to the width of the layer of copper.

19. The interconnect structure of claim 18 which further comprises a dielectric layer located above the passivation layer.

20. The interconnect structure of claim 18 wherein the dielectric layer is a polyimide.

21. The interconnect structure of claim 19 wherein the dielectric layer overlaps the portion of the layer of AlCu which overlaps the passivation layer.

22. The interconnect structure of claim 19 wherein the pad limiting layer overlaps the dielectric layer.

23. The interconnect structure of claim 21 wherein the barrier layer overlaps portions of the dielectric layer.

24. The interconnect structure of claim 14 which further comprises a dielectric layer located above the passivation layer.

25. The interconnect structure of claim 14 wherein the passivation layer is selected from the group consisting of silicon dioxide, silicon nitride, silicon oxynitride and combinations thereof.

26. The structure of claim 11 wherein the layer of copper is about 0.3 to about 2 µm thick.

27. The structure of claim 11 wherein the layer of AlCu contains about 96 to about 99.5 atomic % of Al.

28. The structure of claim 11 wherein the layer of AlCu is about 0.5 to about 1.2 microns thick.

29. The structure of claim 11 wherein the barrier layer is selected from the group consisting of titanium, tantalum, nitrides thereof, mixtures thereof, combinations thereof and alloys thereof.

30. The structure of claim 11 wherein the barrier layer is about 50 to about 1000 Å thick.

31. The structure of claim 11 wherein the barrier layer is a combination of a TaN layer, a Ti layer and a TiN layer.

32. The structure of claim 11 wherein the TiN layer is about 200 to about 700 Å thick, the Ti layer is about 200 to about 700 Å thick, and the TaN layer is about 50 to about 1000 Å thick.

33. The interconnect structure of claim 11 wherein the capping layer comprises silicon nitride.

34. The interconnect structure of claim 33 wherein the capping layer is about 100 to about 1000 Å thick.

35. The interconnect structure of claim 33 wherein the passivation layer is about 1000 to about 9000 Å thick.

36. The structure of claim 11 wherein the pad-limiting layer is selected from at least one member from the group consisting of titanium nitride, copper, gold, titanium tungsten, chromium and combinations thereof.

37. The structure of claim 11 wherein the pad-limiting layer comprises a TiW layer, followed by a CrCu layer, followed by a Cu layer.

* * * * *